US012249596B2

(12) United States Patent
Kang et al.

(10) Patent No.: US 12,249,596 B2
(45) Date of Patent: Mar. 11, 2025

(54) DISPLAY DEVICE AND MANUFACTURING METHOD THEREOF

(71) Applicant: SAMSUNG ELECTRONICS CO., LTD., Suwon-si (KR)

(72) Inventors: Minwoo Kang, Suwon-si (KR); Junghoon Yoon, Suwon-si (KR); Wonyong Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 439 days.

(21) Appl. No.: 17/546,249

(22) Filed: Dec. 9, 2021

(65) Prior Publication Data

US 2022/0208747 A1     Jun. 30, 2022

Related U.S. Application Data

(63) Continuation of application No. PCT/KR2021/001292, filed on Feb. 1, 2021.

(30) Foreign Application Priority Data

Dec. 28, 2020   (KR) .......................... 10-2020-0185189

(51) Int. Cl.
*H01L 25/16*   (2023.01)
*H01L 33/54*   (2010.01)
(Continued)

(52) U.S. Cl.
CPC ............ *H01L 25/167* (2013.01); *H01L 33/54* (2013.01); *H01L 24/32* (2013.01); *H01L 33/56* (2013.01);
(Continued)

(58) Field of Classification Search
CPC ....... H01L 25/167; H01L 33/54; H01L 24/32; H01L 2224/32145; H01L 2933/005;
(Continued)

(56) References Cited

U.S. PATENT DOCUMENTS 8,624,280 B2     1/2014  Won et al.
10,861,906 B2   12/2020  Park et al.
(Continued)

FOREIGN PATENT DOCUMENTS

JP     4734770 B2     7/2011
JP     5496889 B2     5/2014
(Continued)

OTHER PUBLICATIONS

International Search Report (PCT/ISA/210) dated Sep. 23, 2021 issued by the International Searching Authority in International Application No. PCT/KR2021/001292.
(Continued)

*Primary Examiner* — Patricia D Valenzuela
(74) *Attorney, Agent, or Firm* — Sughrue Mion, PLLC

(57) ABSTRACT

A display device is provided. The display device includes a substrate, a plurality of self-emissive devices provided at a front surface of the substrate, a molding layer configured to cover at least a portion of the front surface of the substrate and at least a portion of the plurality of self-emissive devices, the molding layer comprising at least one uneven portion, and a polarizing member spaced apart from a front surface of the molding layer so as to not adhere optically with the molding layer.

10 Claims, 15 Drawing Sheets

(51) Int. Cl.
  *H01L 23/00*    (2006.01)
  *H01L 33/56*    (2010.01)
  *H01L 33/62*    (2010.01)
(52) U.S. Cl.
  CPC .... *H01L 33/62* (2013.01); *H01L 2224/32145* (2013.01); *H01L 2933/005* (2013.01)
(58) Field of Classification Search
  CPC ..... H01L 25/0753; H01L 25/16; H01L 27/12; H01L 33/58; H01L 27/1214; H01L 33/62; H01L 2933/0041; H01L 33/56; G09F 9/302; G09F 9/3023
  See application file for complete search history.

(56)         References Cited

U.S. PATENT DOCUMENTS

| | | |
|---|---|---|
| 11,088,304 B2 | 8/2021 | Han et al. |
| 11,152,548 B2 | 10/2021 | Hwang et al. |
| 11,320,695 B2 | 5/2022 | Zhao et al. |
| 2017/0047393 A1* | 2/2017 | Bower ................ H01L 33/62 |
| 2020/0075820 A1 | 3/2020 | Han et al. |
| 2020/0083397 A1 | 3/2020 | Lee et al. |
| 2020/0161514 A1 | 5/2020 | Hwang et al. |
| 2020/0227600 A1* | 7/2020 | Watanabe ......... G02F 1/133603 |
| 2020/0388731 A1 | 12/2020 | Cha et al. |
| 2021/0318576 A1 | 10/2021 | Zhao et al. |
| 2021/0343910 A1 | 11/2021 | Han et al. |

FOREIGN PATENT DOCUMENTS

| | | |
|---|---|---|
| KR | 1020010095865 A | 11/2001 |
| KR | 10-2013-0022251 A | 3/2013 |
| KR | 101251962 B1 | 4/2013 |
| KR | 1020180063687 A | 6/2018 |
| KR | 1020190062725 A | 6/2019 |
| KR | 10-2020-0027891 A | 3/2020 |
| KR | 1020200029191 A | 3/2020 |
| KR | 10-2020-0057202 A | 5/2020 |
| WO | 2012057163 A1 | 5/2012 |
| WO | 2020/029534 A1 | 2/2020 |

OTHER PUBLICATIONS

Written Opinion (PCT/ISA/237) dated Sep. 23, 2021 issued by the International Searching Authority in International Application No. PCT/KR2021/001292.

Communication dated Jan. 16, 2024 issued by the European Patent Office in European Application No. 21915367.3.

Communication issued on Dec. 21, 2024 by the State Intellectual Property Office of P.R. China in Chinese Application No. 202180052722.X.

Communication issued on Dec. 6, 2024 by the Korean Intellectual Property Office in Korean Application No. 10-2020-0185189.

* cited by examiner

DISPLAY DEVICE AND MANUFACTURING METHOD THEREOF

CROSS-REFERENCE TO RELATED APPLICATIONS

This application is a by-pass continuation of International Application No. PCT/KR2021/001292, filed on Feb. 1, 2021, which is based on and claims priority to Korean Patent Application No. 10-2020-0185189, filed on Dec. 28, 2020, in the Korean Intellectual Property Office, the disclosures of which are incorporated by reference herein in their entireties.

BACKGROUND

1. Field

The disclosure relates to a display device and a manufacturing method thereof, and more particularly, to a display device configured to reduce boundary visibility and external light reflectivity of display modules adjacent to one another, and prevent moire from becoming visible on a screen and a manufacturing method thereof.

2. Description of Related Art

In addition to demands for display devices with continuous high brightness, high resolution, and larger in scale development direction, recently, there are increasing demands for high efficiency, low power, and the like according to trends for an eco-friendly electronic products.

Accordingly, organic light-emitting diode (OLED) panels have been in focus as a new display device to substitute liquid crystal display (LCD) panels, but problems such as high costs due to low production yields, large scale, and reliability issues still remain to be addressed.

As a new product to substitute or complement the above, there is a growing interest in technology which directly mounts micro LEDs emitting red, green and blue colors on a substrate to create a panel.

The display device may be configured to display an image without a backlight by applying self-emissive display devices, and express various colors by being operated in pixel or sub pixel units. The respective pixels or sub pixels may be configured such that an operation is controlled by a thin film transistor (TFT)

SUMMARY

Provided are a display device configured to reduce boundary visibility and external light reflectivity of display modules adjacent to one another, and prevent moire from becoming visible from a side surface of the display device and a manufacturing method thereof.

Additional aspects will be set forth in part in the description which follows and, in part, will be apparent from the description, or may be learned by practice of the presented embodiments.

In accordance with an aspect of the disclosure, a display device may include a substrate, a plurality of self-emissive devices provided at a front surface of the substrate, a molding layer configured to cover at least a portion of the front surface of the substrate and at least a portion of the plurality of self-emissive devices, the molding layer including at least one uneven portion, and a polarizing member spaced apart from a front surface of the molding layer so as to not adhere optically with the molding layer.

The at least one uneven portion may include a plurality of uneven areas arranged irregularly.

The display device may include an air layer provided between the molding layer and the polarizing member. The at least one uneven portion may be provided integrally with the molding layer at a surface of the molding layer which contacts the air layer.

The at least one uneven portion may include a thin film anti-glare (AG) film.

The at least one uneven portion may include a thin film optical film formed with a plurality of fine uneven areas.

The display device may include a filling layer provided between the plurality of self-emissive devices. The filling layer may include a black-based color and is configured to cover side surfaces of the plurality of self-emissive devices.

The filling layer may be configured to cover the front surface of the substrate excluding at least one light-emitting surface of the plurality of self-emissive devices.

The plurality of self-emissive devices may be configured to be electrically and physically coupled to a substrate electrode pad of the substrate through an adhesive layer including an anisotropic conductive film (ACF) or a conductive ink including fine conductive particles.

The plurality of self-emissive devices may be configured to be physically coupled to a substrate electrode pad of the substrate through an adhesive layer including a non-conductive film (NCF).

The polarizing member may include a glass substrate and a circular polarizing layer provided on the glass substrate.

In accordance with an aspect of the disclosure, a method of manufacturing a display device may include transferring a plurality of self-emissive devices to a front surface of a substrate, stacking a molding layer at the front surface of the substrate to cover at least a portion of light-emitting surfaces of the plurality of self-emissive devices, forming an uneven portion on the molding layer, and disposing a polarizing member to be spaced apart from a front surface of the molding layer so as to not optically adhere with the molding layer.

The uneven portion may include a plurality of uneven areas provided on the molding layer.

Forming the uneven portion may include attaching a thin film optical film including a plurality of fine uneven areas on the molding layer.

An air layer may be formed between the molding layer and the polarizing member.

The method may include stacking a filling layer with a black-based color to the substrate so as to expose at least one light-emitting surface of the plurality of self-emissive devices prior to forming the molding layer.

The method may include providing the filling layer between the plurality of self-emissive devices.

The filling layer may be configured to cover the front surface of the substrate excluding at least one light-emitting surface of the plurality of self-emissive devices.

The method may include coupling the plurality of self-emissive devices to a substrate electrode pad of the substrate through an adhesive layer including an ACF or a conductive ink including fine conductive particles.

The method may include coupling the plurality of self-emissive devices to a substrate electrode pad of the substrate through an adhesive layer including an NCF.

The polarizing member may include a glass substrate and a circular polarizing layer provided on the glass substrate.

BRIEF DESCRIPTION OF THE DRAWINGS

The above and other aspects, features, and advantages of certain embodiments of the present disclosure will be more apparent from the following description taken in conjunction with the accompanying drawings, in which.

DETAILED DESCRIPTION

Figure 1:
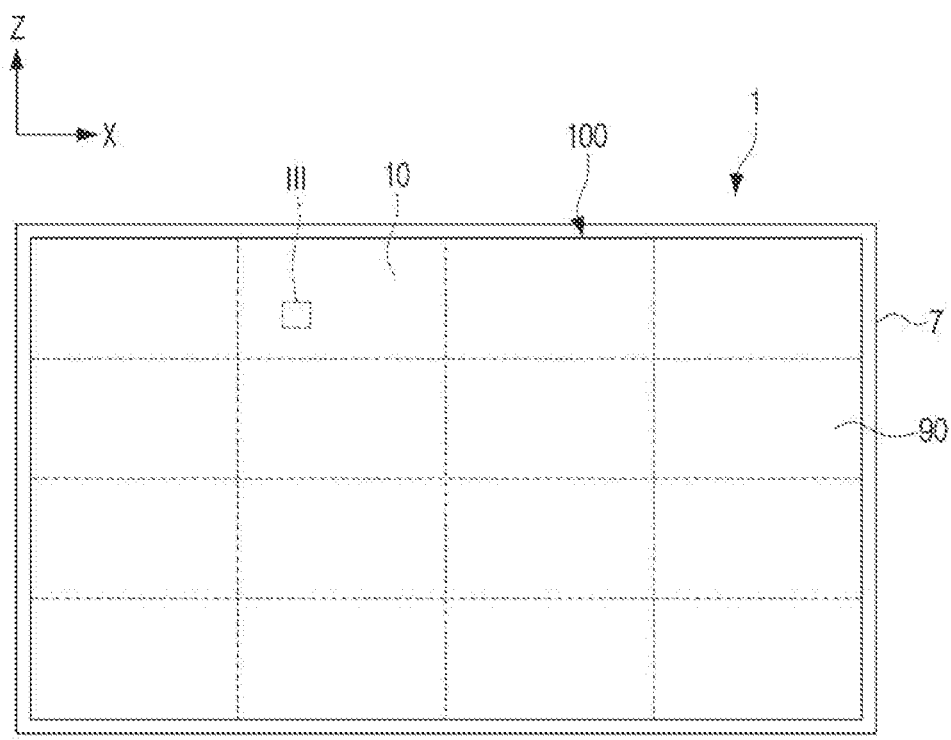
FIG. 1 is a diagram illustrating a display device according to an embodiment.

Various embodiments will be described in greater detail below with reference to the accompanied drawings. The embodiments described herein may be variously modified. Specific embodiments may be illustrated in the drawings and described in detail in the description. However, the specific embodiments described in the accompanied drawings are merely to assist in the understanding of the various embodiments. Accordingly, the various embodiments disclosed in the accompanied drawings are not for limiting the scope of the disclosure to a specific embodiment, and should be interpreted to include all modifications or alternatives included in the technical spirit and scope of the embodiments.

Terms including ordinal numbers such as first, second, and the like may be used to describe various elements, but these elements are not limited by the above-described terms. The above-described terms may be used only to distinguish one element from another element.

In the disclosure, it is to be understood that the terms such as "comprise," "include," or the like are used herein to designate a presence of a characteristic, number, step, operation, element, component, or a combination thereof, and not to preclude a presence or a possibility of adding one or more of other characteristics, numbers, steps, operations, elements, components or a combination thereof. When a certain element is indicated as being "coupled with/to" or "connected to" another element, it is to be understood that the certain element may be directly coupled to or connected to the another element, but that another element may be present therebetween. On the other hand, when a certain element is indicated as being "directly coupled with/to" or "directly connected to" another element, it is to be understood that another element is not present therebetween.

In the disclosure, the expression 'same' may not only mean fully matching, but also include a difference to a degree of taking into consideration a processing error range.

In addition thereto, in describing the disclosure, in case it is determined that the detailed description of related known technologies may unnecessarily obscure the gist of the disclosure, the detailed description thereof will be abridged or omitted.

A display module may be a display panel provided with a micro light-emitting diode (micro LED or µLED) for displaying an image. The display module may be one from among a flat panel display panel, each of which are configured with a plurality of inorganic LEDs of less than or equal to 100 micrometers and may provide better contrast, response time and energy efficiency than a liquid crystal display (LCD) panel which requires a backlight.

Both an OLED and a micro LED, which is an inorganic LED, have good energy efficiency, but the micro LED has a greater brightness, light-emitting efficiency, and life span than the OLED. The micro LED may be a semiconductor chip capable of emitting light on its own when power is supplied. The micro LED may have a fast response rate, low power, and a high brightness. For example, the micro LED may have higher efficiency in converting electricity to photons compared to the LCD or the OLED. That is, a "brightness per watt" compared to the LCD or the OLED display of the related art is higher. Accordingly, the micro LED may be configured to have a same brightness with an energy of about half compared to the LED (e.g., width, length and height respectively exceeding 100 mm) or the OLED. In addition to the above, the micro LED may provide a high resolution, a superior color, shading and brightness, express color of a wide range accurately, and provide a screen that is clear even in the outdoors where sunlight is bright. Further, the micro LED may be guaranteed a long life span because it is strong against a burn in phenomenon and there is no deformation due to little heat being generated. The micro LED may have a flip chip structure in which an anode electrode and a cathode electrode are formed at a same first surface and a light-emitting surface is formed at a second surface positioned at an opposite side of the first surface at which the electrodes are formed.

In the disclosure, a substrate may be disposed with a thin film transistor (TFT) layer on which a TFT circuit is formed at a front surface, and disposed with a timing controller configured to control a power supply circuit and a data driving driver configured to supply power to the TFT circuit at a rear surface, a gate driving driver and respective driving drivers at the rear surface. Multiple pixels arranged on the TFT layer may be driven by the TFT circuit.

In the disclosure, a glass substrate, a synthetic resin-based (e.g., polyimide (PI), polyethylene terephthalate (PET), polyethersulfone (PES), polyethylene naphthalate (PEN), polycarbonate (PC), etc.) substrate having a flexible material, or a ceramic substrate may be used for the substrate.

The TFT layer on which the TFT circuit is formed may be disposed at the front surface of the substrate, and circuits may not be disposed at the rear surface of the substrate. The TFT layer may be formed integrally on the substrate or adhered to one surface of the glass substrate manufactured in a separate film form.

The front surface of the substrate may be divided into an active area and a dummy area. The active area may correspond to an area occupied by the TFT layer at the front surface of the substrate, and the dummy area may be an area excluding the area occupied by the TFT layer at the front surface of the substrate.

An edge area of the substrate may be an outermost side area of the glass substrate. In addition, the edge area of the substrate may be a remaining area excluding an area at which a circuit of the substrate is formed. In addition, the edge area of the substrate may include a part of the front surface of the substrate which is adjacent to a side surface of the substrate and a part of the rear surface of the substrate which is adjacent to the side surface of the substrate. The substrate may be formed as a quadrangle type. Specifically, the substrate may be formed as a rectangle type or a square type. The edge area of the substrate may include at least one side from among the four sides of the glass substrate.

The TFT comprising the TFT layer (or backplane) is not limited to a specific structure or type. For example, the TFT referred in the disclosure may be realized with an oxide TFT and an Si TFT (poly silicon, a-silicon), an organic TFT, a graphene TFT, and the like in addition to a low-temperature polycrystalline silicon TFT (LTPS TFT), and may be applied by making only a P type (or N type) metal-oxide-semiconductor field-effect transistor (MOSFET) in a Si wafer complementary metal-oxide-semiconductor (CMOS) process.

A pixel driving method of the display module may be an active matrix (AM) driving method or a passive matrix (PM) driving method. The display module may be configured to form a wiring pattern to which the respective micro LEDs are electrically connected according to the AM driving method or the PM driving method.

A one pixel area may be disposed with a plurality of pulse amplitude modulation (PAM) control circuits. In this case, respective sub pixels disposed at the one pixel area may be controlled by the corresponding PAM control circuits. In addition, the one pixel area may be disposed with a plurality of pulse width modulation (PWM) control circuits. In this case, the respective sub pixels disposed at the one pixel area may be controlled by the corresponding PWM control circuits.

The one pixel area may be disposed with both the plurality of PAM control circuits and the plurality of PWM control circuits. In this case, some from among the sub pixels disposed at the one pixel area may be controlled by the PAM control circuit and the remaining may be controlled through the PWM control circuit. In addition, the respective sub pixels may be controlled by the PAM control circuit and the PWM control circuit.

The display module may include multiple side surface wirings of a thin film thickness disposed at a certain distance along the side surface of the TFT substrate.

The display module may include multiple through wiring members formed so as to not be exposed toward the side surface of the TFT substrate in place of the side surface wiring exposed toward the side surface of the TFT substrate. Accordingly, by minimizing the dummy area and maximizing the active area at the front surface of the TFT substrate, the bezel may be made bezel-less, and a mounting density of the micro LEDs with respect to the display module may be increased.

Based on coupling multiple display modules providing a bezel-less form, a large size multi display device capable of maximizing the active area may be provided when coupling the multiple display apparatus. In this case, the respective display modules may be formed to maintain a pitch between the respective pixels of the display module adjacent to one another to be the same as a pitch between the respective pixels in a signal display module based on to minimizing the dummy area. Accordingly, this may be one method for a seam to be not visible at a coupling part between the respective display modules.

A display part having a large screen size may be formed by connecting the multiple display modules, and a polarizing member may be disposed at a front of the display part to reduce boundary visibility, wherein the seam is made visible at a boundary of the respective display modules, and to reduce external light reflectivity. The polarizing member may include, for example, a transparent glass and a circular polarizing layer stacked at the front surface of the transparent glass. In this case, the polarizing member may be formed with an air layer of a predetermined thickness between the display part and the polarizing member according to being disposed spaced apart at the front of the display part.

A driving circuit may be realized by a micro integrated circuit (IC) configured to control the driving of at least 2n pixels disposed at the pixel area. Based on applying the micro IC to the display module, rather than the TFT, only a channel layer connecting the micro IC with the respective micro LEDs may be formed at the TFT layer (or backplane).

The display module may be installed, as a single unit, in a wearable device, a portable device, a handheld device, and an electronic product requiring various displays or applied in an electric field, and may be applied to a display device such as, for example, and without limitation, a monitor for a personal computer, a high resolution television (TV) and signage (or, digital signage), an electronic display, or the like through a plurality of assemblies as a matrix type.

The display module according to an embodiment will be described below with reference to the accompanied drawing.

Figure 2:
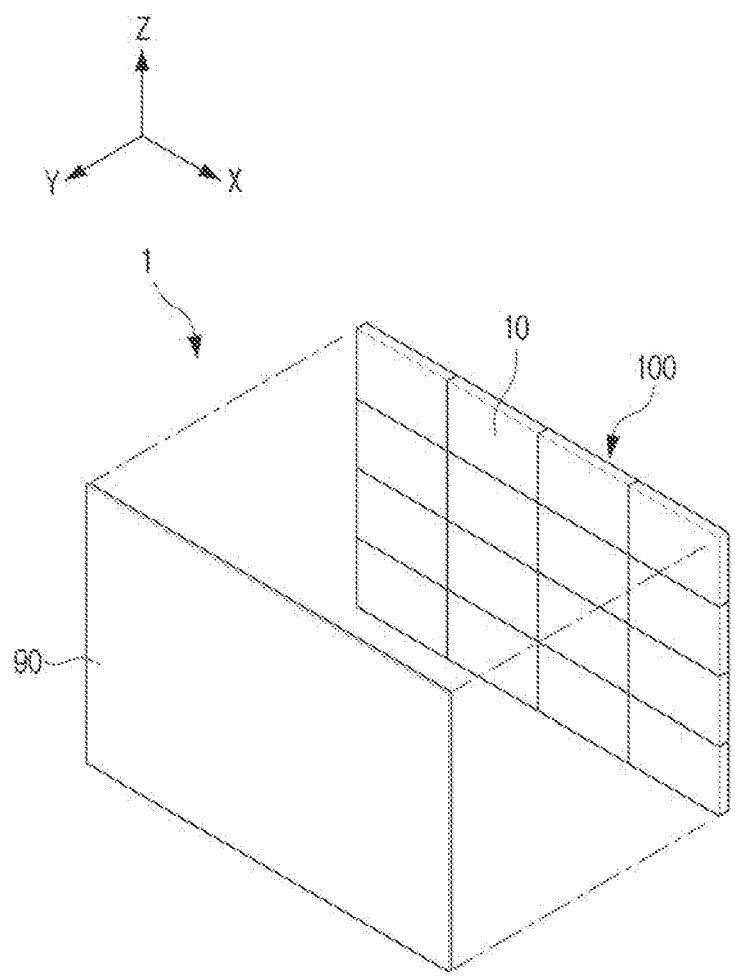
FIG. 2 is a diagram illustrating an example of disposing a display part in which multiple display modules are connected and an external light reflection preventing member at a front thereof according to an embodiment.
Figure 3:
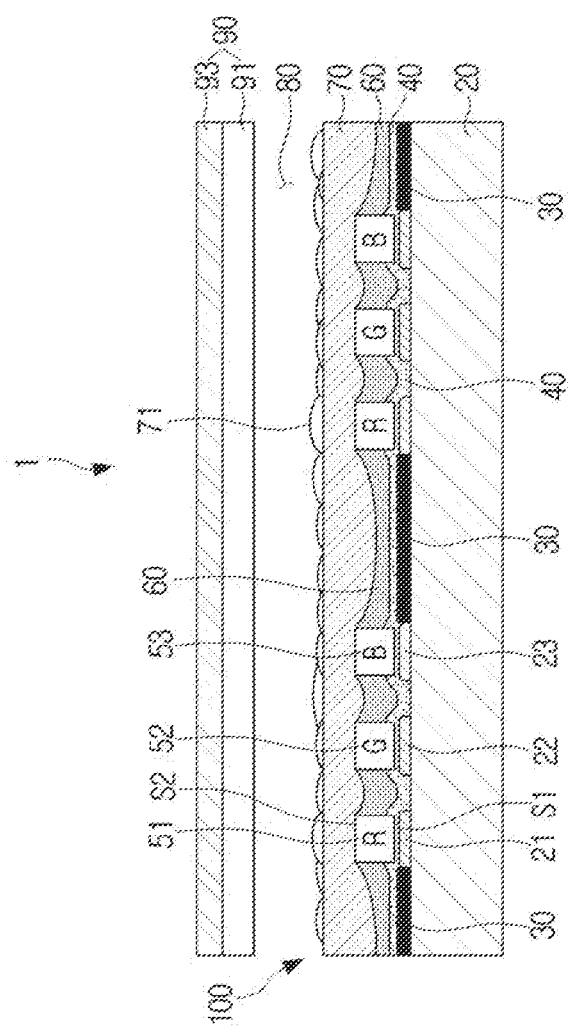
FIG. 3 is a diagram illustrating part III shown in FIG. 1 according to an embodiment.

FIG. 1 is a diagram illustrating a display device according to an embodiment. FIG. 2 is a diagram illustrating an example of disposing a display part in which multiple display modules are connected and an external light reflection preventing member at a front thereof according to an embodiment. FIG. 3 is a diagram illustrating part III shown in FIG. 1 according to an embodiment.

Referring to FIG. 1 and FIG. 2, the display device 1 may include a display part 100 configured to couple the multiple display modules 10 to provide a large size screen, and a polarizing member 90 disposed spaced apart by a predetermined distance at the front of the display part 100.

The display part 100 may be formed by using multiple display modules 10 having a certain size and continuously coupling in a row direction and a column direction. In this case, the display modules adjacent to one another may be physically and electrically coupled.

The display part 100 may form a square type having a same width and length ratio or a rectangle type having a different width and length ratio according to the form of arranging the multiple display modules 10. The width and length size of the polarizing member 90 may correspond to the width and length size of the corresponding display part 100.

The polarizing member 90 may be disposed at the front of the display part to reduce boundary visibility, where the seam is made visible at a boundary of the respective display modules, and to reduce external light reflectivity.

Referring to FIG. 3, the polarizing member 90 may be formed roughly in a plate form, and may include a transparent glass substrate 91 and a circular polarizing layer 93 stacked at one surface of the glass substrate 91.

The circular polarizing layer 93 may reduce, based on having a black based color, boundary visibility, where the seam is made visible at a boundary of the respective display modules, and to reduce reflectivity by absorbing external light.

The polarizing member 90 may be disposed to be spaced apart at a predetermined distance at the front of the display part 100. Accordingly, an air layer 80 of a predetermined thickness may be formed between the polarizing member 90 and the display part 100.

The polarizing member 90 may be supported by a bezel member 7 surrounding an outer part of the display part 100. Accordingly, the polarizing member 90 may be disposed to be spaced apart at a predetermined distance from the display part 100.

Although not illustrated in the drawings, the bezel member 7 may be omitted from the display device 1. In this case, the polarizing member 90 may be disposed to be spaced apart from the display part 100 through various support structures. For example, in order to dispose the polarizing member 90 to be spaced apart from the display part 100, multiple spacers may be disposed between the polarizing member 90 and the display part 100. In this case, it may be preferable for the spacer to have transparency to a degree the emission amount of the micro LED is not reduced and be disposed at a point where it does not have an effect on or has a minimal effect on emission.

As described above, by forming the air layer 80 between the polarizing member 90 and the display part 100, issues that may occur with respect to the reflectivity and thickness of the display module 10 may be resolved.

For example, based on stacking a layer (i.e., uneven layer) on which multiple uneven areas are formed at the front surface of the display module 10 to resolve moire from being visible from the side surface of the display device 1, reduction in visibility may be apparent due to an increase in reflectivity by the uneven areas. In addition, based on stacking so as to contact a polarizing layer to the front surface of the display module 10, the thickness of the display module 10 may be increased, and thereby the amount of light lost at an end part of the display module 10 may be increased and a color seam of a color displayed at the end part of the display module 10 not being represented to a desired color may appear.

Based on spacing apart the polarizing member 90 from the front surface of the display part 100 by the thickness of the air layer 80, the thickness of the display module 10 may be prevented from increasing by the polarizing member 90 and the above-described relevant problems may be fundamentally resolved.

Figure 4:
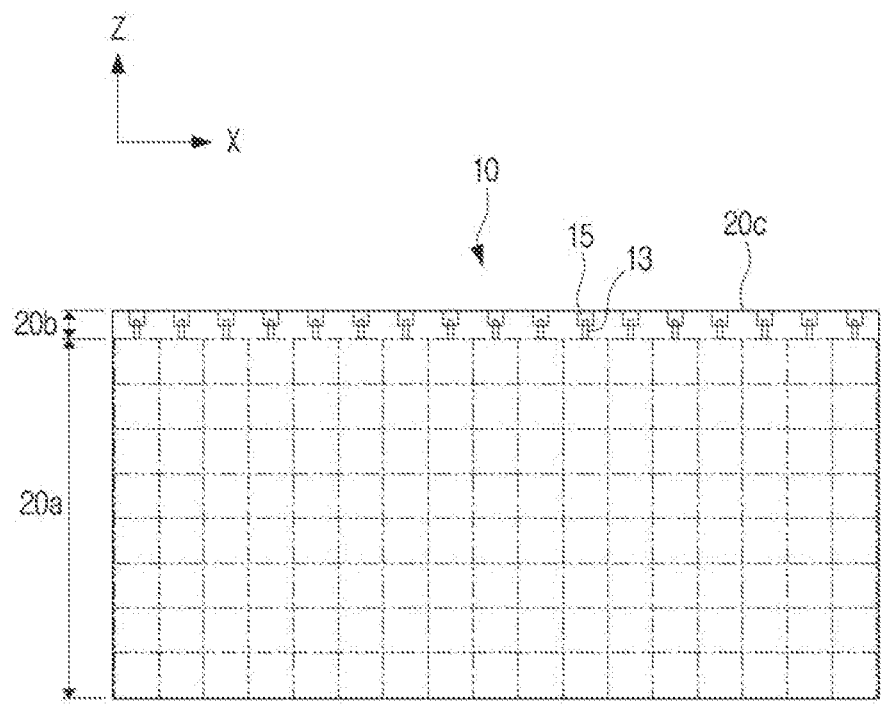
FIG. 4 is a diagram illustrating one display module according to an embodiment.

FIG. 4 is a diagram illustrating one display module according to an embodiment.

Referring to FIG. 4, the display module 10 may include a TFT substrate 20 and multiple micro LEDs 51, 52 and 53 arranged on the TFT substrate 20.

The TFT substrate 20 may include a glass substrate and a TFT layer included with a TFT circuit at the front surface of the glass substrate. In addition, the TFT substrate 20 may be disposed at a rear surface of the glass substrate and include multiple side surface wirings 15 electrically coupling a circuit configured to supply power to the TFT circuit and electrically coupled with a separate control substrate, and the TFT circuit.

The TFT substrate 20 may include an active area 20a representing an image and a dummy area 20b incapable of representing an image at the front surface.

The active area 20a may be divided into multiple pixel areas at which multiple pixels are respectively arranged. The multiple pixel areas may be divided into various forms, and as an example, may be divided into a matrix form as in FIG. 4. The respective pixel areas may include a sub pixel area in which multiple sub pixels are mounted, and a pixel circuit area in which a pixel circuit for driving the respective sub pixels is disposed.

The multiple micro LEDs 51, 52 and 53 may be light-emitting devices for displaying an image. The multiple micro LEDs 51, 52 and 53 may be transferred to the pixel circuit area of the TFT layer, and electrode pads of the respective micro LEDs may be electrically coupled to substrate electrode pads 21, 22 and 23 (FIG. 3) formed at the sub pixel area of the TFT layer, respectively. A common electrode pad may be formed in a straight-line form considering the arrangement of at least three micro LEDs 51, 52 and 53 positioned at the respective pixels areas. The multiple micro LEDs may be a sub pixels forming a single pixel. In the disclosure, one micro LED may refer to one sub pixel, and the relevant terms may be used interchangeably.

Three red, green and blue micro LEDs 51, 52 and 53 have been described as forming one pixel, but the embodiment is not limited thereto, and any number of micro LEDs may form one pixel.

The pixel driving method of the display module 10 according to an embodiment may be the AM driving method or the PM driving method. The display module 10 may be configured to form a wiring pattern to which respective micro LEDs are electrically coupled according to the AM driving method or the PM driving method.

The dummy area 20b may be included in the edge area of the glass substrate. For example, the edge area of the disclosure may be an area in which multiple side surface wirings 15 are formed, and may include a part of the front surface of the TFT substrate 20 adjacent to the side surface 20c of the TFT substrate 20 and a part of the rear surface of the TFT substrate 20 adjacent to the side surface 20c of the TFT substrate 20.

Referring to FIG. 3, the display module 10 may be formed with multiple substrate electrode pads 21, 22 and 23 at the front surface of the TFT substrate 20. The multiple substrate electrode pads 21, 22 and 23 may be electrically connected with multiple micro LEDs 51, 52 and 53. Accordingly, the multiple micro LEDs 51, 52 and 53 may be coupled with the TFT circuit of the TFT layer through the multiple substrate electrode pads 21, 22 and 23.

The display module 10 has been described as including the TFT substrate 20, but is not limited thereto, and may apply a substrate with no TFT layer that includes the TFT circuit. In this case, the driving circuit disposed to the rear surface of the TFT substrate 20 may be realized by a micro integrated circuit (IC) which controls the driving of at least 2n pixels disposed at the pixel area. Based on applying the micro IC to the display module 10 as described above, only the channel layer connecting the micro IC with the respective micro LEDs may be formed in place of the TFT on the TFT layer.

The display module 10 may be configured such that an insulating layer 30, an adhesive layer 40, a filling layer 60, and a molding layer 70 is sequentially stacked at the front surface of the TFT substrate 20. The respective layers stacked at the front surface of the TFT substrate 20 will be described below with reference to FIG. 3.

The insulating layer 30 may be stacked at the front surface of the TFT substrate 20 to protect the TFT circuit of the TFT substrate 20 and prevent short circuiting between adjacent wirings. In this case, the substrate electrode pads 21, 22 and 23 which require an electrical connection with the micro LEDs 51, 52 and 53 may not be covered by the insulating layer 30. The insulating layer 30 may be formed by applying, for example, a photo-imageable solder resist (PSR) ink.

The adhesive layer 40 may be formed stacked at the front surface of the TFT substrate 20 to fix the multiple micro LEDs 51, 52 and 53 to the TFT substrate 20. In this case, the adhesive layer 40 may be stacked at the front surface of the TFT substrate 20 to cover the whole front surface of the TFT substrate 20 for convenience of process.

The adhesive layer 40 may be an anisotropic conductive film (ACF) or a non-conductive film (NCF).

When using the ACF as the adhesive layer 40, to prevent the manufacturing cost of the whole display device from rising due to the high material cost of the ACF, a conductive ink including multiple nano-conductive particles may be used to form the adhesive layer 40. In this case, the adhesive layer 40 may be stacked selectively only at the substrate electrode pads 21, 22 and 23 and a surrounding area of the substrate electrode pads 21, 22 and 23 from the whole front surface area of the TFT substrate 20.

The respective micro LEDs may have a flip chip structure in which an anode electrode and a cathode electrode are formed at the same first surface S1 and the light-emitting surface is formed at the second surface S2 positioned at the opposite side of the first surface S1 at which the electrodes are formed.

The multiple micro LEDs 51, 52 and 53 may be electrically coupled to the corresponding substrate electrode pads 21, 22 and 23 through a thermal compression process after being transferred to the TFT substrate 20, and may be stably fixed to the TFT substrate 20 by the adhesive layer 40.

The filling layer 60 may be stacked at the front surface of the TFT substrate 20, and may cover the whole front surface of the TFT substrate 20 excluding a light-emitting surface S2 of the multiple micro LEDs 51, 52 and 53.

The filling layer 60 may be formed of an insulating material, and may absorb light diverged from the side surface and back surface S1 of the multiple micro LEDs 51, 52 and 53 based on having a black-based color and prevent a cross talk phenomenon between the adjacent micro LEDs. Accordingly, there may be no need for the display module 10 to form a separate black matrix because the filling layer 60 is able to perform the black matrix role.

The molding layer 70 may cover the filling layer 60 and the light-emitting surface S2 of the multiple micro LEDs 51, 52 and 53. The molding layer 70 may be a transparent resin and may be formed by an ultraviolet (UV) curable molding method.

The molding layer 70 may be formed with an uneven portion 71 at the whole surface. The uneven portion 71 may prevent moire from becoming visible when viewing the screen of the display device 1 obliquely from the side surface.

The uneven portion 71 may include multiple unevenness disposed irregularly by processing imprinting of the surface of the molding layer 70. Accordingly, based on the uneven portion 71 being formed integrally with the molding layer 70 without being stacked as a separate layer to the molding layer 70, the thickness of the display module 10 may be prevented from increasing. Accordingly, the color seam may be prevented from becoming visible at the end part of the display module 10 due to the thickness of the display module 10 increasing.

Because the polarizing member 90 is disposed to be spaced apart by a predetermined distance at the front of the display part 100, the thickness of the display module 10 is not increased by the polarizing member 90. Accordingly, in the disclosure, when an anti-glare (AG) film of a thin film is stacked at the molding layer 70 in place of the uneven portion 71, the thickness increase of the display module 10 may be minimized and moire may be prevented from becoming visible. In addition, an optical film formed with fine unevenness may be formed laminating the molding layer 70 through a pressure sensitive adhesive (PSA) in place of the uneven portion 71.

A manufacturing process of the display device 1 according to an embodiment of the disclosure will be described below with reference to FIG. 5 to FIG. 13.

Figure 5:
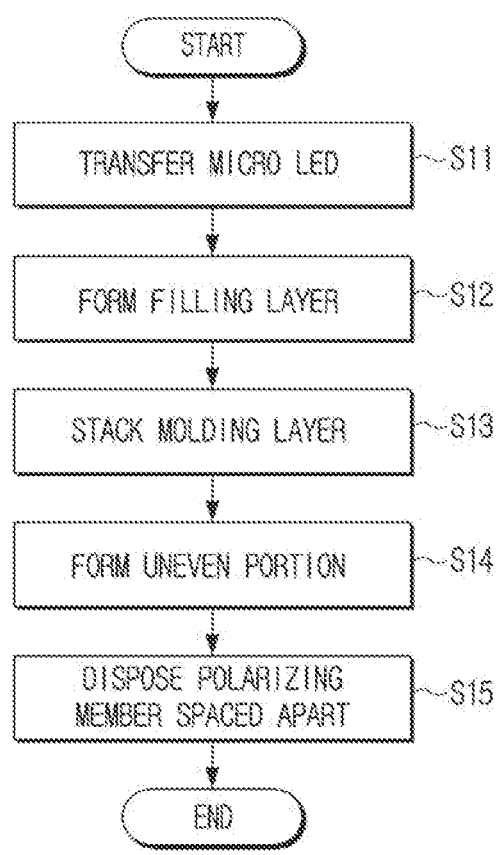
FIG. 5 is a flowchart of a method of manufacturing a display device according to an embodiment.
Figure 6:
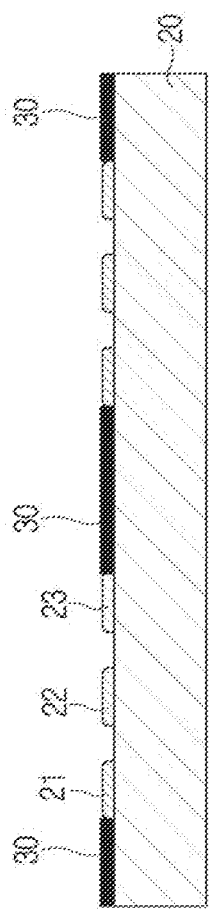
FIG. 6 is a cross-sectional view illustrating an example of a thin film transistor (TFT) substrate on which an insulating layer is formed at a front surface according to an embodiment.

FIG. 5 is a flowchart of a method of manufacturing a display device according to an embodiment. FIG. 6 is a cross-sectional view illustrating an example of a thin film transistor (TFT) substrate on which an insulating layer is formed at a front surface according to an embodiment.

Referring to FIG. 6, the insulating layer 30 may be formed on the glass substrate and the TFT substrate 20 on which the TFT layer is formed on the glass substrate.

The multiple substrate electrode pads 21, 22 and 23 to which micro LEDs 51, 52 and 53 transferred to the TFT substrate are respectively connected may be arranged at the front surface of the TFT substrate 20.

The insulating layer 30 may cover the remaining area excluding the area in which the multiple substrate electrode pads 21, 22 and 23 are disposed from among the whole front surface area of the TFT substrate 20.

The insulating layer 30 may be formed at the front surface of the TFT substrate 20 by sequentially proceeding with an exposure and curing process after applying the insulating material, for example, the PSR ink.

Figure 7:
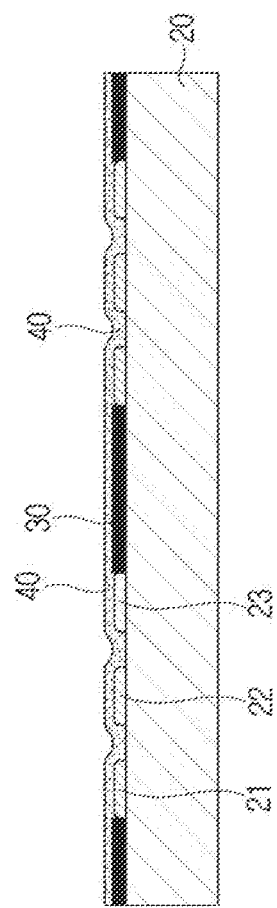
FIG. 7 is a diagram illustrating an example of laminating an adhesive layer to a TFT substrate according to an embodiment.

FIG. 7 is a diagram illustrating an example of laminating an adhesive layer to a TFT substrate according to an embodiment.

Referring to FIG. 7, the adhesive layer 40 may be attached to the front surface of the TFT substrate 20 through a laminating method. The ACF or the NCF may be used as the adhesive layer 40.

The adhesive layer 40 may be selectively stacked only to a desired area and not attached to the whole front surface area of the TFT substrate 20. In this case, the adhesive layer 40 may be formed by using the conductive ink including the multiple nano-conductive particles.

As described above, when forming the adhesive layer 40 with the conductive ink, the adhesive layer 40 may be stacked by spraying the conductive ink selectively only at the substrate electrode pads 21, 22 and 23 and the surrounding areas of the substrate electrode pads 21, 22 and 23 from the whole front surface area of the TFT substrate 20.

Figure 8:
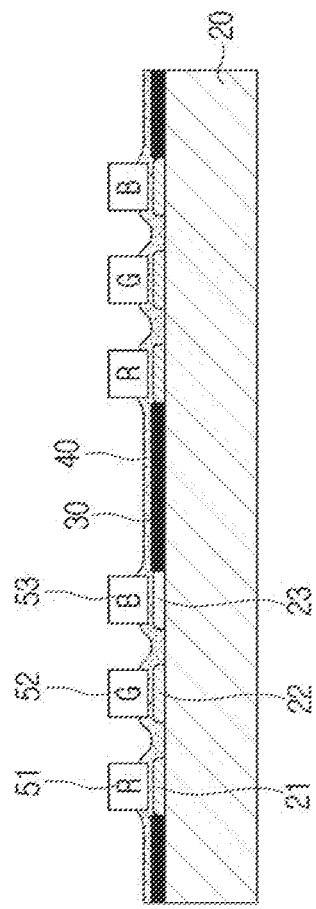
FIG. 8 is a diagram illustrating an example of transferring multiple micro light emitting diodes (LEDs) to a TFT substrate according to an embodiment.

FIG. 8 is a diagram illustrating an example of transferring multiple micro LEDs to a TFT substrate according to an embodiment.

Referring to FIG. 8, in operation S11 (FIG. 5), the multiple micro LEDs 51, 52 and 53 may be transferred to the TFT substrate 20.

The multiple micro LEDs grown from an epi-substrate may be separated from the epi-substrate through a laser lift-off (LLO) method and arranged on a relay substrate. The micro LEDs adjacent to one another which are arranged on the relay substrate may maintain a first chip pitch in an X-axis direction (or, row direction) and maintain a second chip pitch in a Y-axis direction (or, column direction)

The multiple micro LEDs 51, 52 and 53 transported to the relay substrate may be transferred to the TFT substrate 20 through a transfer process such as, for example, a laser transfer method, a rollable transfer method, and a pick and place transfer method.

When transferring to the TFT substrate 20, the multiple micro LEDs 51, 52 and 53 may be transferred to the TFT substrate 20 in a chip pitch different from the respective first and second chip pitches on the relay substrate.

The multiple micro LEDs 51, 52 and 53 transferred to the TFT substrate 20 may be disposed at the corresponding substrate electrode pads 21, 22 and 23, respectively. In this state, the multiple micro LEDs 51, 52 and 53 may be thermally compressed toward the TFT substrate 20 side by using a pressing member. In this case, a die supporting the TFT substrate 20 and the pressing member may be respectively installed with a heater (e.g., sheath heater, etc.).

Based on a part of the adhesive layer 40 (e.g., part positioned between the multiple micro LEDs and the substrate electrode pads) being melted by heat generated when performing the thermal compression, the multiple micro LEDs 51, 52 and 53 may be stably fixed physically to the respective substrate electrode pads 21, 22 and 23 of the TFT substrate 20. In this case, the multiple micro LEDs 51, 52 and 53 may contact the electrode pads 21, 22 and 23 by a pressing force by the pressing member and be electrically coupled.

Figure 9:
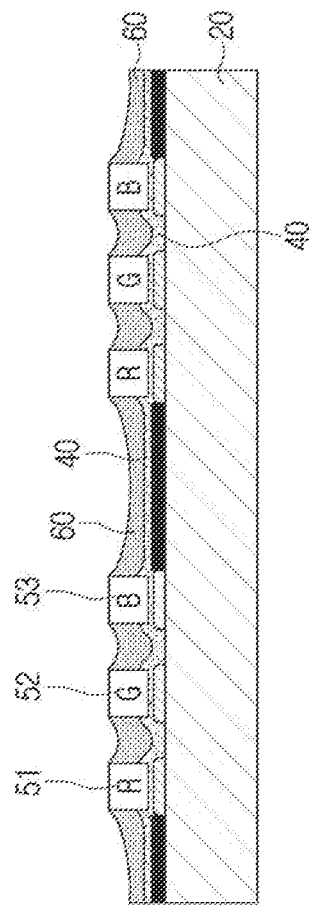
FIG. 9 is a diagram illustrating an example of a filling layer being stacked at a front surface of a TFT substrate which excludes a light-emitting surface of multiple micro LEDs according to an embodiment.

FIG. 9 is a diagram illustrating an example of a filling layer being stacked at a front surface of a TFT substrate which excludes a light-emitting surface of multiple micro LEDs according to an embodiment.

Referring to FIG. 9, in operation S12 (FIG. 5), a filling layer may be formed by applying an insulating material capable of absorbing light at the front surface of the TFT substrate 20 to which multiple micro LEDs 51, 52 and 53 are transferred.

The filling layer 60 may be formed in a black-based color so that light absorption is possible. The filling layer 60 may be applied to cover the whole front surface of the TFT substrate 20 excluding the light-emitting surface S2 of the multiple micro LEDs 51, 52 and 53.

The thickness of the filling layer 60 may have a thickness roughly corresponding to the thickness from the surface (e.g., the boundary of the adhesive layer 40 and the filling layer 60) of the adhesive layer 40 to the light-emitting surface S2 of the multiple micro LEDs 51, 52 and 53.

In this case, the filling layer 60 may, based on being formed to surround the side surfaces of the multiple micro LEDs 51, 52 and 53 in all directions, absorb light being diverged from the back surface S1 of the multiple micro LEDs 51, 52 and 53 and prevent the cross talk phenomenon from occurring between the adjacent micro LEDs. As described above, the filling layer 60 may perform the black matrix role.

Figure 10:
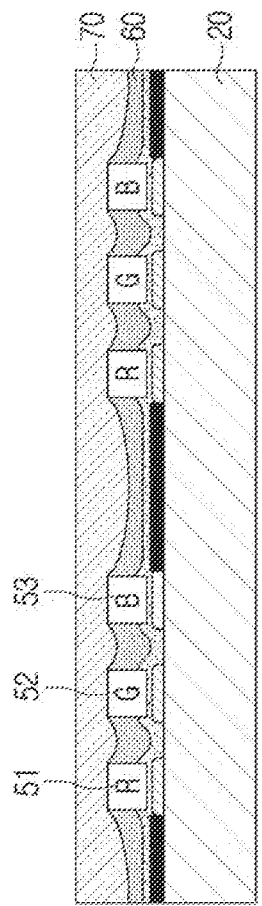
FIG. 10 is a diagram illustrating an example of stacking a molding layer to cover a filling layer and a light-emitting surface of multiple micro LEDs according to an embodiment.
Figure 11:
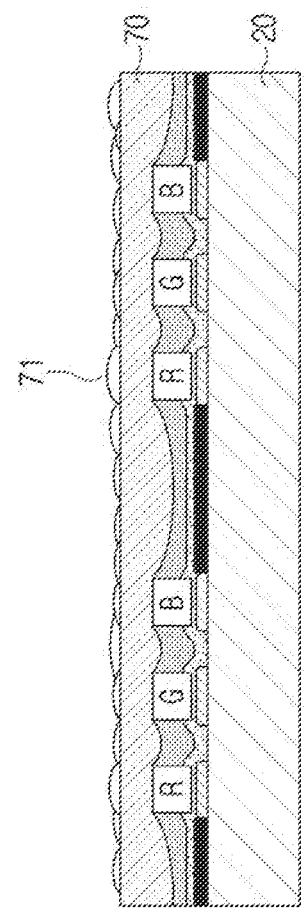
FIG. 11 is a diagram illustrating an example of forming an uneven portion at a surface of a molding layer according to an embodiment.

FIG. 10 is a diagram illustrating an example of stacking a molding layer to cover a filling layer and a light-emitting surface of multiple micro LEDs according to an embodiment. FIG. 11 is a diagram illustrating an example of forming an uneven portion at a surface of a molding layer according to an embodiment.

Referring to FIG. 10, in operation S13 (FIG. 5), a molding layer 70 may be stacked at the whole front surface area of the TFT substrate 20.

The molding layer 70 may be formed through the UV curing molding in which a resin having a transparency to a degree the light diverged from the light-emitting surface of the multiple micro LEDs 51, 52 and 53 satisfies the amount of light required covers the filling layer 60 and the light-emitting surface of the multiple micro LEDs 51, 52 and 53.

Referring to FIG. 11, in operation S14 (FIG. 5), the surface of the molding layer 70 may be imprinting processed and an uneven portion 71 including the multiple unevenness arranged irregularly at the whole surface of the molding layer 70 may be formed.

Based on the uneven portion 71 being formed by processing the surface of the molding layer 70, the thickness of the display module 10 may not be increased. The uneven portion 71 may be formed with respect to the whole surface area of the molding layer 70.

Based on forming the uneven portion 71 at the surface of the molding layer 70 as described above, moire may be prevented from becoming visible when a viewer views the screen of the display device 1 obliquely from the side surface of the display device 1 from an oblique direction.

Based on stacking the AG film of the thin film at the molding layer 70 in place of the uneven portion 71, the thickness increase of the display module 10 may be minimized and moire may be prevented from becoming visible. In addition, the optical film formed with fine unevenness may be formed laminating the molding layer 70 through the PSA in place of the uneven portion 71.

Figure 12:
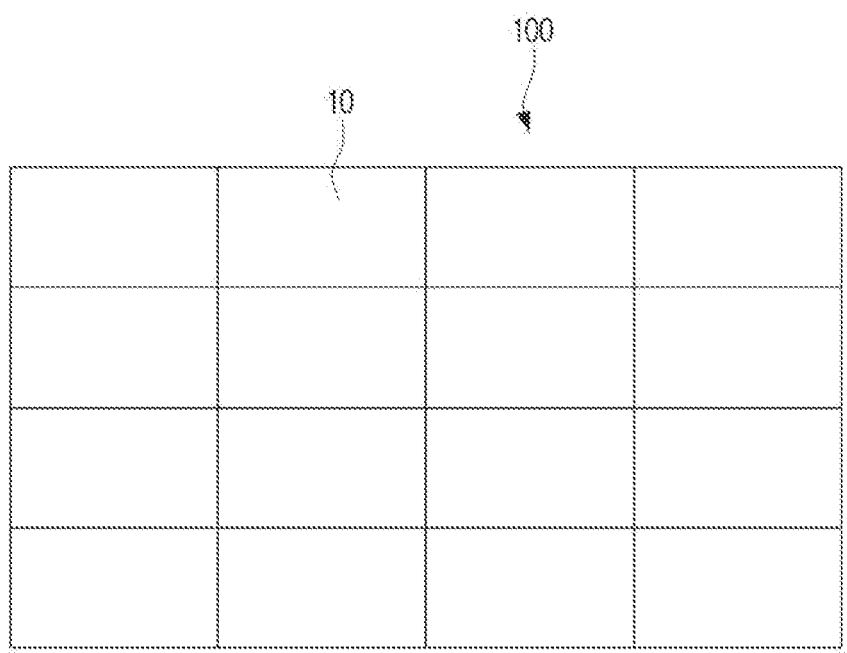
FIG. 12 is a diagram illustrating a display part that couples multiple display modules to form a large screen size according to an embodiment.
Figure 13:
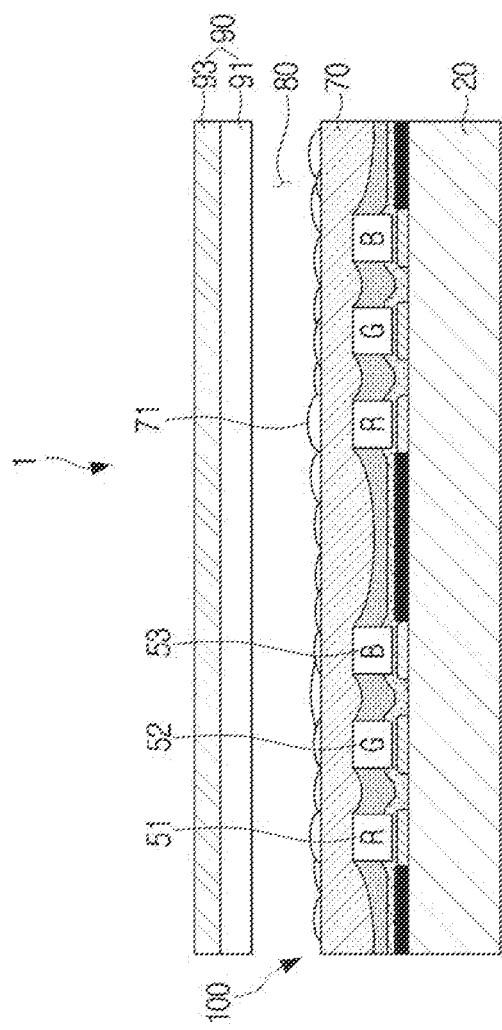
FIG. 13 is a diagram illustrating an example of an air layer being formed between a display part and an external light reducing member by disposing a polarizing member at a front surface of a display part at a predetermined distance according to an embodiment.

FIG. 12 is a diagram illustrating a display part that couples multiple display modules to form a large screen size according to an embodiment. FIG. 13 is a diagram illustrating an example of an air layer being formed between a display part and an external light reducing member by disposing a polarizing member at a front surface of a display part at a predetermined distance according to an embodiment.

Referring to FIG. 12, the display module 10 formed through the sequential process described above may form the display part 100 by continuously coupling multiple in a row direction and a column direction.

Referring to FIG. 13, in operation S15 (FIG. 5), the front of the display part 100 may be disposed with the polarizing member 90 spaced apart at a pre-set distance.

The polarizing member 90 may prevent the boundary between the display modules 10 coupled with one another by the circular polarizing layer 93 having a black-based color from becoming visible, and reduce external light reflectivity.

The polarizing member 90 may maintain a spacing distance by the bezel member 7 (FIG. 1) disposed at the outer part of the display part 100. In this case, the air layer 80 may be formed between the polarizing member 90 and the display part 100. Accordingly, the molding layer 70 and the polarizing member 90 of the respective display modules 10 may not be optically adhered to one another.

The light diverged from the multiple micro LEDs arranged at the respective display modules 10 of the display part 100 may not refracted as it passes the air layer 80 and may be wholly irradiated to the outside of the display device 1 through the polarizing member 90.

As described above, based on the polarizing member 90 being disposed to be spaced apart so as to place an air gap with respect to the respective display parts 100, the thickness of the display module 10 may not be increased. Accordingly, the problems described above according to the thickness increase of the display module 10 may be fundamentally blocked.

The display device 1 may be configured such that the bezel member 7 is omitted, and in this case, it may be possible to dispose the polarizing member 90 to be spaced apart from the display part 100 through various support structures not illustrated in the drawings.

For example, a transparent spacer may be disposed between the polarizing member 90 and the display part 100. In this case, it may be preferable for the spacer to be formed of a material having a transparency which does not reduce the emission amount of the micro LED, and minimize loss or reflection of light. In addition, it may be preferable for the spacer to be disposed at a point it does not have an effect on or minimize the emission amount of the micro LEDs.

Figure 14:
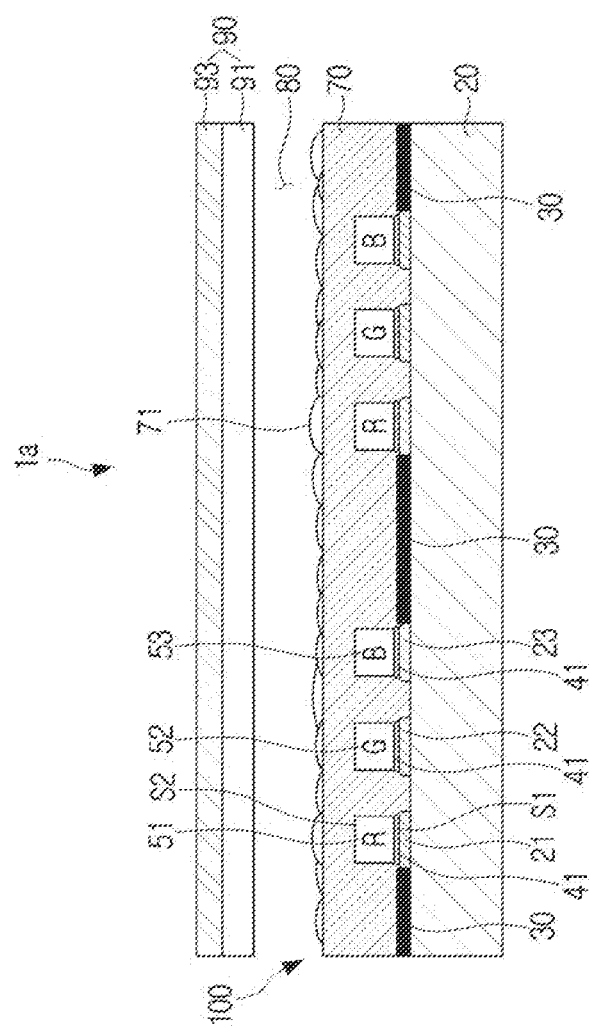
FIG. 14 is a flowchart of a method of manufacturing a display device according to an embodiment.
Figure 15:
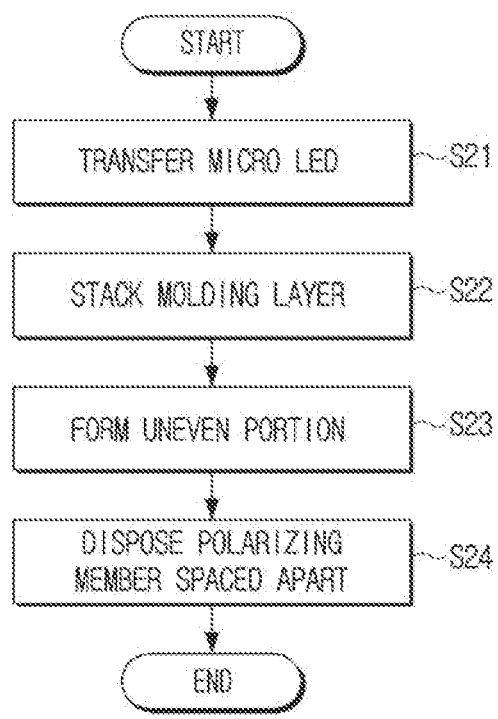
FIG. 15 is a diagram illustrating a part of a display module of a display device according to an embodiment.

FIG. 14 is a flowchart of a method of manufacturing a display device according to an embodiment. FIG. 15 is a diagram illustrating a part of a display module of a display device according to an embodiment.

A display device 1a according to an embodiment of the disclosure may be mostly similar with the structure of the display device 1 described above and may apply the same reference numerals with respect to the same elements. The display device 1a may be described below, but descriptions on the same elements as with the display device 1 described above may be omitted.

Referring to FIG. 14, the display device 1a may omit the adhesive layer 40 (FIG. 3) of the display device 1 described above. In this case, the display device 1a may include a soldering member 41 which may substitute the adhesive layer 40. The soldering member 41 may be a solder ball or a micro bump.

The soldering member 41 may be patterned on the substrate electrode pads 21, 22 and 23 through a reflow process. The multiple micro LEDs 51, 52 and 53 may be electrically and physically coupled to the substrate electrode pads 21, 22 and 23 by the soldering member 41 going through the thermal compression process after the transferring process.

The display device 1a may omit, differently from the display device 1 described above, the filling layer 60 (FIG. 3). In this case, the molding layer 70 may fill between the multiple micro LEDs 51, 52 and 53.

Referring to FIG. 15, the display device 1a according to an embodiment may be manufactured with a slightly different process from the display device 1 described above.

First, the insulating layer 30 may be formed at the remaining area excluding the area in which the multiple substrate electrode pads 21, 22 and 23 are disposed from among the whole front surface area of the TFT substrate 20.

The soldering member 41 may be applied on the respective substrate electrode pads 21, 22 and 23 through the reflow process.

Then, in operation S21, the multiple micro LEDs 51, 52 and 53 may be transferred to the TFT substrate 20. The multiple micro LEDs 51, 52 and 53 may be thermally compressed in this state toward the TFT substrate 20 side by using the pressing member. Accordingly, the multiple micro LEDs 51, 52 and 53 may be stably fixed physically and electrically coupled to the respective substrate electrode pads 21, 22 and 23 of the TFT substrate 20 as the soldering member 41 is melted by the heat generated when performing the thermal compression.

Then, in operation S23, the molding layer 70 may be stacked using the UV curing molding method at the whole front surface area of the TFT substrate 20 (S22), and form the uneven portion 71 including multiple unevenness arranged irregularly at the whole surface of the molding layer.

In this case it may be possible to perform the laminating process of the AG film of the thin film at the molding layer 70 in place of the uneven portion 71.

In operation S24, after forming the display part 100 by continuously coupling the multiple display modules 10 formed through the process as described above in multiples in the row direction and the column direction, the polarizing member 90 may be disposed to be spaced apart at a pre-set distance at the front of the display part 100.

The display device 1a according to an embodiment described above may, like the display device 1 described above, not only reduce the boundary visibility of the display modules 10 adjacent to one another and the external light reflectivity, but also prevent moire from becoming visible from the side surface of the display device 1a.

In the above, various embodiments of the disclosure have been described respectively and individually, but the respective embodiments may not necessarily be implemented on its own, and the configuration and operation of the respective embodiment may be implemented in combination with at least one other embodiment.

While the disclosure has been illustrated and described with reference to various example embodiments thereof, it will be understood that the various example embodiments are intended to be illustrative, not limiting. It will be understood by those skilled in the art that various changes in form and details may be made therein without departing from the true spirit and full scope of the disclosure, including the appended claims and their equivalents.

What is claimed is:

1. A display device comprising:
   a substrate;
   a plurality of self-emissive devices provided at a front surface of the substrate;
   a molding layer configured to cover at least a portion of the front surface of the substrate and contacting a light-emitting surface of at least one of the plurality of self-emissive devices, the molding layer comprising at least one uneven portion; and
   a polarizing member spaced apart from a front surface of the molding layer so as to not adhere optically with the molding layer.

2. The display device of claim 1, wherein the at least one uneven portion comprises a plurality of uneven areas arranged irregularly.

3. The display device of claim 1, further comprising an air layer provided between the molding layer and the polarizing member, and
   wherein the at least one uneven portion is formed integrally with the molding layer at a surface of the molding layer which contacts the air layer.

4. The display device of claim 1, wherein the at least one uneven portion comprises a thin film anti-glare (AG) film.

5. The display device of claim 1, wherein the at least one uneven portion comprises a thin film optical film formed with a plurality of fine uneven areas.

6. The display device of claim 1, further comprising a filling layer provided between the plurality of self-emissive devices,
- wherein the filling layer comprises a black-based color and is configured to cover side surfaces of the plurality of self-emissive devices.

7. The display device of claim 6, wherein the filling layer is configured to cover the front surface of the substrate excluding at least one light-emitting surface of the plurality of self-emissive devices.

8. The display device of claim 6, wherein the plurality of self-emissive devices are electrically and physically coupled to a substrate electrode pad of the substrate through an adhesive layer comprising an anisotropic conductive film (ACF) or a conductive ink comprising fine conductive particles.

9. The display device of claim 6, wherein the plurality of self-emissive devices are physically coupled to a substrate electrode pad of the substrate through an adhesive layer comprising a non-conductive film (NCF).

10. The display device of claim 1, wherein the polarizing member comprises:
- a glass substrate; and
- a circular polarizing layer provided on the glass substrate.

* * * * *